(12) United States Patent
Moulard

(10) Patent No.: US 9,479,138 B2
(45) Date of Patent: Oct. 25, 2016

(54) MICROELECTROMECHANICAL SYSTEMS DEVICE PACKAGE AND METHOD FOR PRODUCING THE MICROELECTROMECHANICAL SYSTEMS DEVICE PACKAGE

(71) Applicant: EPCOS AG, Munich (DE)

(72) Inventor: Gilles Moulard, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/784,351

(22) PCT Filed: May 24, 2013

(86) PCT No.: PCT/EP2013/060776
§ 371 (c)(1),
(2) Date: Oct. 14, 2015

(87) PCT Pub. No.: WO2014/187505
PCT Pub. Date: Nov. 27, 2014

(65) Prior Publication Data
US 2016/0049918 A1 Feb. 18, 2016

(51) Int. Cl.
*H01L 29/82* (2006.01)
*H03H 9/02* (2006.01)
*B81B 7/00* (2006.01)
*B81C 1/00* (2006.01)

(52) U.S. Cl.
CPC ........ *H03H 9/02244* (2013.01); *B81B 7/0038* (2013.01); *B81C 1/00285* (2013.01)

(58) Field of Classification Search
CPC ................... H01L 29/84; H01L 29/86; H01L 2924/1461; H01L 24/97
USPC .................................................. 257/415–420
See application file for complete search history.

(56) References Cited

U.S. PATENT DOCUMENTS

| | | | |
|---|---|---|---|
| 7,868,448 B2 | 1/2011 | Metzger | |
| 8,571,239 B2* | 10/2013 | Feiertag | H01L 24/97 381/174 |
| 8,842,859 B2* | 9/2014 | Delaus | B81C 1/0023 174/262 |
| 9,278,854 B2* | 3/2016 | Pahl | H01L 22/12 |
| 2006/0131501 A1 | 6/2006 | Ikushima et al. | |
| 2011/0165718 A1 | 7/2011 | Lutz et al. | |
| 2011/0290552 A1 | 12/2011 | Palmateer et al. | |
| 2012/0328779 A1 | 12/2012 | Caplet et al. | |

FOREIGN PATENT DOCUMENTS

| | | |
|---|---|---|
| CN | 102040186 A | 5/2011 |
| EP | 2537797 A1 | 12/2012 |
| JP | 2029017 A | 1/1990 |
| WO | 2004065289 A2 | 8/2004 |
| WO | 2005076470 A1 | 8/2005 |
| WO | 2005113376 A1 | 12/2005 |

* cited by examiner

*Primary Examiner* — Cuong Q Nguyen
(74) *Attorney, Agent, or Firm* — Slater Matsil, LLP

(57) ABSTRACT

A microelectromechanical systems device package includes a MEMS device mounted in flip-chip technology on a substrate. A film of non-evaporable getter material is disposed between the substrate and the MEMS device. A cover structure encapsulates the MEMS device. This invention further provides a method for manufacturing the microelectromechanical systems device package.

20 Claims, 3 Drawing Sheets

MICROELECTROMECHANICAL SYSTEMS DEVICE PACKAGE AND METHOD FOR PRODUCING THE MICROELECTROMECHANICAL SYSTEMS DEVICE PACKAGE

This patent application is a national phase filing under section 371 of PCT/EP2013/060776, filed May 24, 2013, which is incorporated herein by reference in its entirety.

TECHNICAL FIELD

This invention is related to microelectromechanical systems (MEMS) such as SAW devices and BAW/FBAR resonators or filters, or sensors. Particularly, this invention relates to MEMS device packages and to methods for producing the same.

BACKGROUND

Microelectromechanical systems (MEMS) typically include micromechanical elements, actuators and electronics. After fabrication, an MEMS device can be housed in a chamber for protection of the mechanical structure against damage and contamination with impurities that may cause degradation, deviance, or failure of the MEMS device.

For instance, JP 2029017 A discloses a packaging method for a surface acoustic wave device, wherein a wire-bonded SAW and a wire-bonded, conduction-active solid getter are sealed under vacuum in a package. CN 102040186 A relates to a high vacuum ceramic leadless chip carrier (LCC) packaging method, wherein an MEMS device is packaged by the steps of plasma cleaning, eutectic surface mount, lead interconnection, getter activation and eutectic sealing. US patent application US 2011/0290552 A1 discloses an MEMS device package structure including an interferometric modulator array formed on a substrate and encapsulated between the substrate and a back plane, wherein in a cavity between the back plane and the substrate a chemically active getter material is positioned above the interferometric modulator array. US patent application US 2011/0165718 A1 discloses a method for manufacturing microelectromechanical systems having mechanical structures that are encapsulated in a chamber using thin-film wafer level encapsulation techniques, wherein an integrated getter area and/or enhanced volume of the chamber is provided by forming gaps, trenches and/or slices in a periphery area of the MEMS device.

The methods for manufacturing of these types of MEMS packages are relatively complex and expensive. In addition, such conventional MEMS packages typically lead to a relatively large overall size of the package in comparison to the dimensions of the MEMS itself, and therefore do not meet the present demand for smaller MEMS components required in miniaturized circuitries and devices with higher component density.

SUMMARY

Embodiments of the present invention provide an improved microelectromechanical systems device package, which overcomes or reduces at least some of the disadvantages of the above-mentioned state of the art.

In a first aspect, the invention provides a microelectromechanical systems device package, which comprises a substrate with a first substrate plane and a second substrate plane opposite to the first substrate plane, and with a first and a second connector pad arranged on the first substrate plane. An MEMS device with a first and a second contact pad arranged on a front side of the MEMS device is mounted in flip-chip technology on the first substrate plane, so that the front side of the MEMS device faces the first substrate plane and the first and second contact pad are electrically interconnected with the first and second connector pad, thereby forming an interspace between the MEMS device and the first substrate plane. A film of a non-evaporable getter material is disposed on the first substrate plane at least partially in the interspace. A cover structure encapsulates the MEMS device by sealing to the first substrate plane and enclosing the MEMS device between the first substrate plane and the cover structure.

As used therein, the non-evaporable getter (NEG) material shall mean a reactive material having the ability to combine with gas molecules chemically or by absorption. In particular, it shall be understood that the term "non-evaporable getter" is used herein in distinction from "evaporable getters", i.e., the non-evaporable getter material remains in the solid state during deposition or activation instead of being evaporated and condensed on a surface.

MEMS devices such as BAW or FBAR resonators or filters can be very sensitive to absorption or adsorption of gas or moisture on a surface thereof. This phenomenon can act as a mass loading effect resulting, for instance, in a frequency shift of the device. Further, this can cause corrosion of fine conductor lines of, e.g., SAW devices and, thus, degradation or failure of the device. Whilst MEMS device packages can be sealed under vacuum, the inventors of the present invention realized that this does not prevent adsorption or absorption of molecules that are out-gassed or desorbed from materials contained within the package, or are diffusing from the outside into a non-hermetically sealed package.

By depositing a film of non-evaporable getter material in the MEMS package, the inventors of the present invention accomplish maintenance of a high vacuum inside the package, thereby advantageously reducing or avoiding the adverse impact of gas contaminants on the MEMS device. In this way, a higher accuracy of the electrical and mechanical characteristics of the MEMS device and an improved long-term performance are achieved. At the same time, the package assembly of the present invention is much smaller than conventional packaging assemblies which use, for instance, wire bonding to electrically connect the MEMS device to an external circuitry.

In one embodiment, the MEMS device package further comprises a third and a fourth connector pad arranged on the second substrate plane. The third connector pad is electrically interconnected with the first connector pad and the fourth connector pad is electrically interconnected with the second connector pad. For example, the third and fourth connector pad can be adapted for interconnecting the MEMS device package with an external circuitry. In particular, the third and fourth connector pad can be adapted for surface mounting of the MEMS device package on a circuit board. In this way, the space requirements of the device package can be significantly reduced which in turn allows miniaturization of circuitries and devices and also reduces production costs.

The MEMS device can also comprise further contact pads. For example, contact pads for electrical grounding, antenna connection, signal input and/or signal output may be present.

In some embodiments, the substrate comprises at least one ceramic layer. Preferably, the substrate comprises a ceramic device with a stack of at least two ceramic layers and at least one electrode layer arranged between the ceramic layers in the stack. The substrate can further comprise vertical electrical connections electrically interconnecting the connector pads on the first substrate plane with the connector pads on the second substrate plane and/or the at least one electrode layer. In this way, a particularly reliable electrical interconnection of the device package with an external circuitry can be achieved.

The ceramic device can also comprise a multitude of ceramic layers and electrode layers arranged between the ceramic layers. Moreover, the ceramic device can further comprise passive electrical elements, for example, resistors, capacitors and/or inductors. In this way, a high integration and functionality of the device can be achieved by the package, whilst at the same time the overall dimensions of the package are kept advantageously small.

Preferably, the ceramic device is a monolithic multilayer component with a stack of co-sintered ceramic layers and at least one electrode layer between the ceramic layers. For example, the monolithic ceramic multilayer component can be high temperature co-fired ceramics (HTCC) formed at a sinter temperature of about 1,600° C. Preferably, the monolithic multilayer component is a low temperature co-fired ceramic formed at a sintering temperature of around 1,000° C. or lower. The electrode layers and connector pads can, for instance, comprise copper, gold and/or silver.

In one embodiment, the MEMS device package further comprises a fifth and a sixth connector pad arranged on the first substrate plane and a seventh and an eight connector pad arranged on the second substrate plane. The seventh connector pad is electrically interconnected with the fifth connector pad, the eighth connector pad is electrically interconnected with the sixth connector pad. The film of the non-evaporable getter material is electrically interconnected with the fifth and sixth connector pads. This arrangement allows, for instance, applying an electrical current to the film of the non-evaporable getter material via the connector pads. For example, the electrical current can be used to locally heat up the NEG film for activating the NEG using Joule heating. In an alternative embodiment, a heating component which converts electricity into heat can be electrically interconnected with the fifth and sixth connector pads, and the non-evaporable getter material can be arranged in heat conductive contact with the heating component. In this way, the NEG material can be indirectly heat-activated by applying an electrical current to the heating component via the connector pads. Such arrangements may, for example, be used in embodiments wherein the NEG material is not electrically conductive.

The cover structure can be hermetically sealing to the first substrate plane or non-hermetically sealing to the first substrate plane. Preferably, the cover structure is hermetically sealing to the first substrate plane.

In one embodiment, the cover structure comprises a first coating with a polymer film which seals to the first substrate plane in a first periphery area and encloses the MEMS device between the first substrate plane and the polymer film. The polymer film may, for instance, comprise a polyimide film. A suitable example is a poly(4,4'-oxydiphenylene-pyromellitimide) film, such as Kapton.

In one embodiment, the cover structure comprises at least one further coating arranged over the polymer film and sealing to the first substrate plane in a second periphery area around the first periphery area and enclosing the MEMS device between the first substrate plane, the polymer film and the at least one further coating of an inorganic material layer. For example, the at least one further coating can comprise a metallic coating, a silicon oxide coating, a silicon nitride coating or combinations thereof.

In one embodiment, the non-evaporable getter material comprises Zr, V, Ti, Fe or combinations thereof. In certain examples, a zirconium vanadium titanium alloy or a zirconium vanadium iron alloy may be present. With these materials, activation of the NEG material can be accomplished at relatively low temperatures, so that thermal degradation of the packaging during heat activation of the NEG is effectively avoided when NEG activation takes place inside the package.

In one embodiment, the MEMS device is selected from a group consisting of a SAW device, a BAW resonator and a FBAR resonator. In particular, the MEMS device is a BAW resonator or FBAR resonator.

In a second aspect, the invention provides a method for producing the microelectromechanical systems device package. The method comprises the steps:
providing the microelectromechanical system device package described above,
sealing the package,
activating the non-evaporable getter material.

In one embodiment, method step A) comprises the following sub-steps:
A1) providing the substrate,
A2) disposing the film of the non-evaporable getter material on the first substrate plane.

Method step A2) can for instance comprise sputter deposition, physical vapor deposition, printing, dip coating or spin coating of the non-evaporable getter material on the first substrate plane.

In one embodiment, the method step A2) further comprises sub-step A2') patterning of the film of the non-evaporable getter material. In order to achieve patterning of the film of the non-evaporable getter material, a structured masking layer can be arranged on the first substrate plane prior to disposing the film of the non-evaporable getter material on the first substrate plane. The masking layer can have openings exposing the first substrate plane to the film of the non-evaporable getter material during deposition. The masking layer is removed from the first substrate plane after deposition of the film of the non-evaporable getter material thereby removing that part of NEG material that has been deposited onto the masking layer. Patterning of the film of the non-evaporable getter material can also be achieved by etching the film of the non-evaporable getter material after deposition. Alternatively, a combination of a masking layer and etching of the film of the non-evaporable getter material after deposition can be used.

In one embodiment, a vacuum is maintained in method step B) and/or method step C). Suitable vacuum conditions include, for example, high vacuum conditions with a pressure of max. $10^{-3}$ mbar ($10^{-3}$ hPa) or lower. More preferred is a pressure of max. $10^{-4}$ mbar ($10^{-4}$ hPa) or lower.

In another embodiment, method step C) comprises heat-activating the film of the non-evaporable getter material at a temperature between 150° C. and 500° C., preferably between 200° C. and 400° C.

When the fifth, sixth, seventh and eighth connector pads are present, the heat activating of the film of the non-evaporable getter material can be accomplished using ohmic heating by applying an electrical current to the film of the non-evaporable getter material via the fifth through eighth connector pads. In this way, an essentially selective heating up of the NEG film is achieved, so that thermal degradation of more temperature-sensitive components of the MEMS device package, such as the cover structure, is advantageously prevented. In embodiments wherein the fifth, sixth, seventh and eighth connector pads are not present, heat activation of the film of the non-evaporable getter material can also be achieved by heating the MEMS device package up to a temperature that activates the film of the non-evaporable getter material but does not degrade the packaging. This type of activation can, for instance, be done in a furnace.

BRIEF DESCRIPTION OF THE DRAWINGS

Examples of microelectromechanical systems device packages are shown in the following schematic figures. The examples in the figures are to be understood to be illustrative only and not intended to limit the scope of the invention to specific details. Individual elements in the figures may be labelled with reference numerals. For clarity reasons, however, recurring elements may not be multiply labelled.

DETAILED DESCRIPTION OF ILLUSTRATIVE EMBODIMENTS

Figure 1:
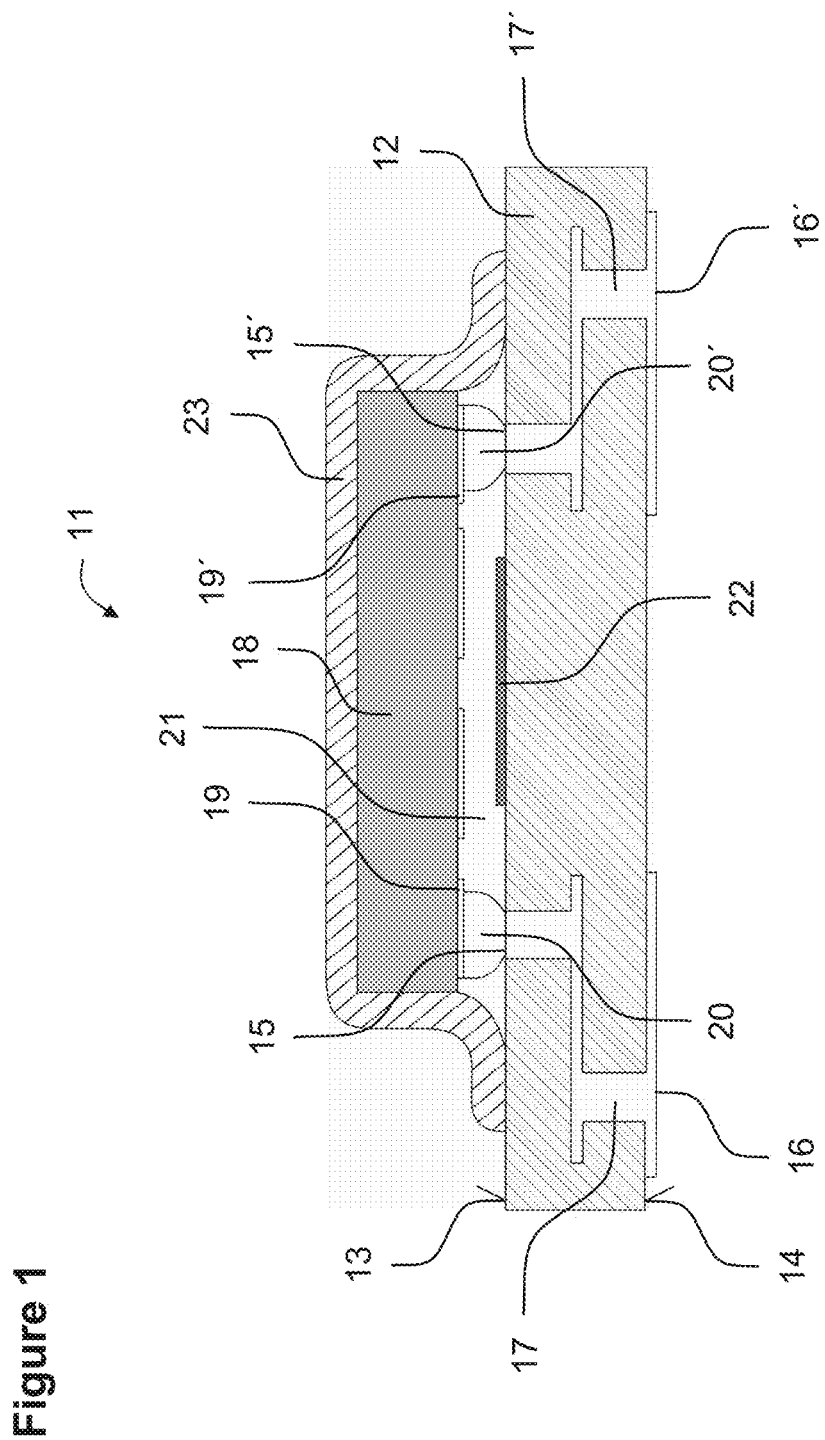
FIG. 1 shows a cross-section of a basic example of a MEMS device package according to the present invention.

FIG. 1 shows an example of a basic MEMS systems device package 11 of the present invention. The package comprises the substrate 12 with a first substrate plane 13 and a second substrate plane 14 opposite to the first substrate plane. First and second connector pads 15, 15' are arranged on the first substrate plane and third and fourth connector pads 16, 16' are arranged on the second substrate plane. The substrate comprises a ceramic device with a stack of two ceramic layer and an electrode layer arranged between the ceramic layers. Vertical electrical connections 17, 17' go through the ceramic layers and electrically interconnect the connector pads on the first substrate plane with the electrode layers and the connector pads on the second substrate plane. The MEMS device 18 with a first and a second contact pad 19, 19' arranged on a front side of the MEMS device, is mounted in flip-chip technology on the first substrate plane so that the front side faces the first substrate plane. The first and second contact pad is electrically interconnected with the first and second connector pad. For example, solder bumps 20, 20' can be used to complete the interconnect of the contact pads and the connector pads. An interspace 21 is present between the MEMS device and the first substrate plane. A film of non-evaporable getter material 22 is disposed at least partially in the interspace. The MEMS device is encapsulated between the substrate and a cover structure 23 arranged over and around the MEMS device and sealing to the first substrate plane 13.

Figure 2:
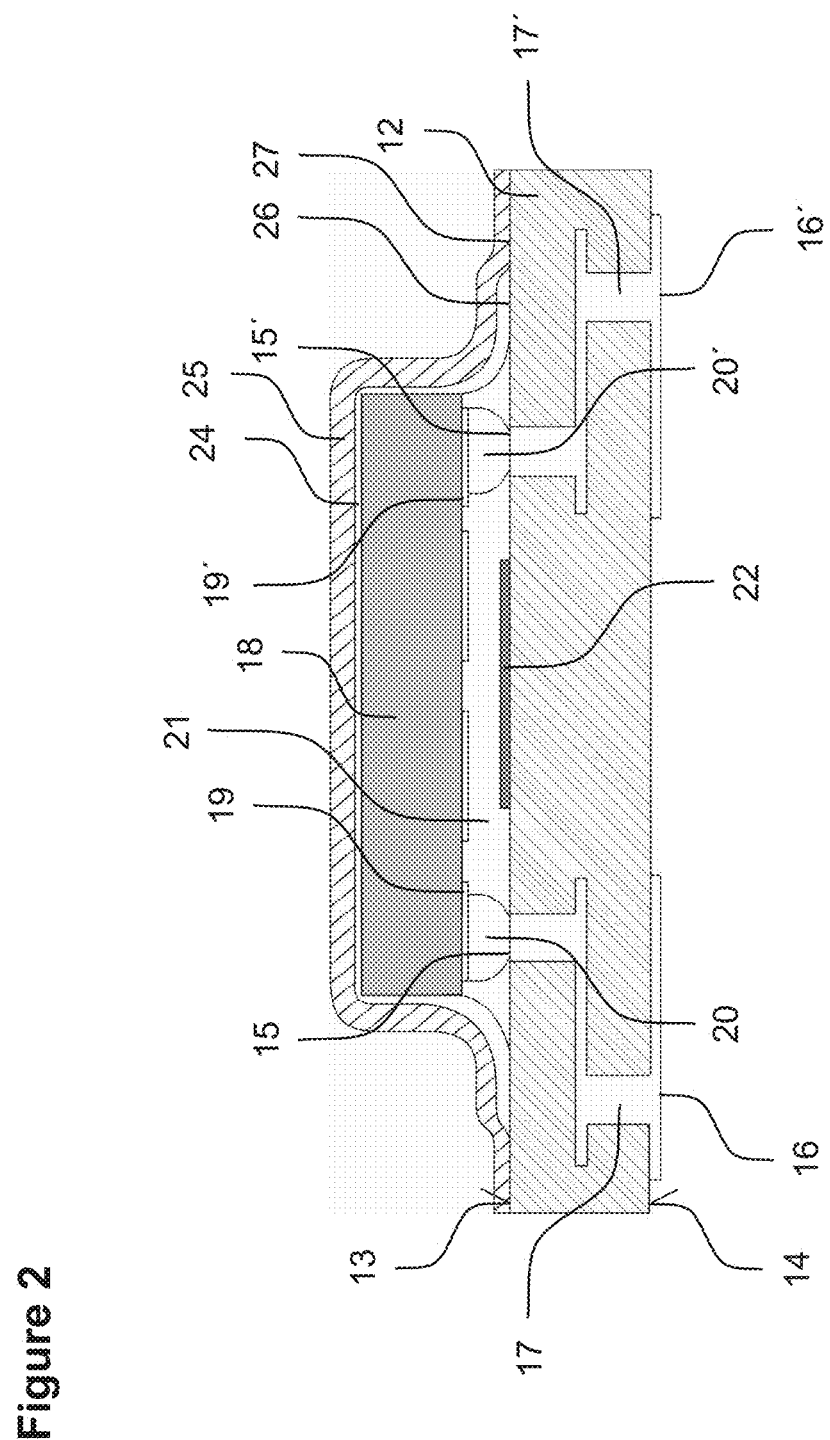
FIG. 2 shows cross-section of a MEMS device package with a cover structure comprising first and second coatings.

FIG. 2 shows essentially the MEMS device package of FIG. 1 in a further embodiment wherein the cover structure comprises a first coating that is a polymer film 24 and a second coating 25 arranged over the polymer film. The polymer film seals to the first substrate plane 13 in a first periphery area 26 and encloses the MEMS device between the first substrate plane and the polymer film. The second coating 25 seals to the first substrate plane 13 in a second periphery area 27 and encloses the MEMS device between the first substrate plane 13, the polymer film 24 and the second coating 25.

Figure 3:
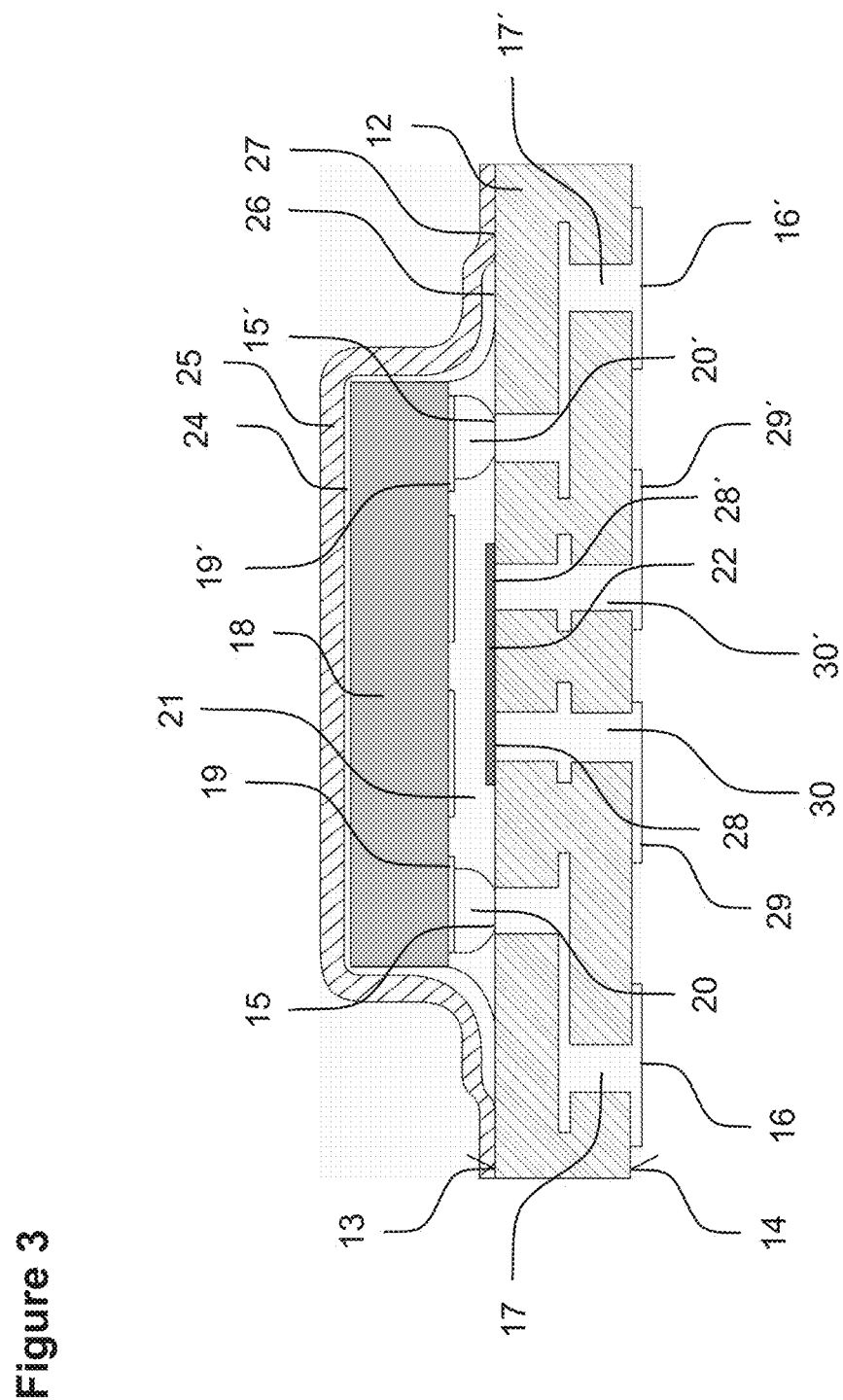
FIG. 3 shows a cross-section of a further development of the MEMS device package of FIG. 2 with electrically interconnected film of non-evaporable getter material.

FIG. 3 shows a cross-section of a MEMS device package wherein the substrate 12 comprises fifth and sixth connector pads 28, 28' arranged on the first substrate plane 13 and seventh and eight connector pads 29, 29' arranged on the second substrate plane 14, wherein the film of the non-evaporable getter material 22 is electrically interconnected with the fifth and sixth connector pad 28, 28' and through vertical electrical connections 30, 30' to the seventh and eighth connector pad 29, 29' arranged on the second substrate plane 14. In this example, via said connector pads and vertical electrical connections an electrical current can be selectively applied to the NEG film 22 in order to locally heat up the NEG film for activation without risk of thermal degradation of other components of the device package.

The invention claimed is:

1. A microelectromechanical systems (MEMS) device package, comprising:
    a substrate with a first substrate plane and a second substrate plane opposite the first substrate plane, a first and a second connector pad being arranged on the first substrate plane;
    a MEMS device with a first contact pad and a second contact pad arranged on a front side of the MEMS device, wherein the MEMS device is mounted in flip-chip technology on the first substrate plane, the front side facing the first substrate plane and the first and second contact pad being electrically interconnected with the first and second connector pad, thereby forming an interspace between MEMS device and first substrate plane;
    a film of a non-evaporable getter material disposed on the first substrate plane at least partially in the interspace; and
    a cover structure encapsulating the MEMS device by sealing to the first substrate plane and enclosing the MEMS device between the first substrate plane and the cover structure.

2. The MEMS device package of claim 1, further comprising a third connector pad and a fourth connector pad arranged on the second substrate plane, the third connector pad being electrically interconnected with the first connector pad and the fourth connector pad being electrically interconnected with the second connector pad.

3. The MEMS device package of claim 1, wherein the substrate comprises a ceramic layer.

4. The MEMS device package of claim 1, wherein the substrate comprises a ceramic device with a stack of ceramic layers and an electrode layer arranged between the ceramic layers in the stack.

5. The MEMS device package of claim 1, wherein the substrate further comprises a fifth connector pad and a sixth connector pad arranged on the first substrate plane, a seventh connector pad and an eighth connector pad arranged on the second substrate plane, the seventh connector pad being electrically interconnected with the fifth connector pad and the eighth connector pad being electrically interconnected with the sixth connector pad, and wherein the film of the non-evaporable getter material is electrically interconnected with the fifth and sixth connector pad.

6. The MEMS device package of claim 1, wherein the cover structure is hermetically sealed to the first substrate plane.

7. The MEMS device package of claim 1, wherein the cover structure comprises a first coating with a polymer film sealed to the first substrate plane in a first periphery area and enclosing the MEMS device between the first substrate plane and the polymer film.

8. The MEMS device package of claim 7, wherein the cover structure comprises a further coating arranged over the polymer film and sealed to the first substrate plane in a second periphery area around the first periphery area and enclosing the MEMS device between the first substrate plane, the polymer film and the further coating.

9. The MEMS device package of claim 8, wherein the further coating comprises a metallic coating, a silicon oxide coating, or a silicon nitride coating or combinations thereof.

10. The MEMS device package of claim 1, wherein the non-evaporable getter material comprises Zr, V, Ti, or Fe, or combinations thereof.

11. The MEMS device package of claim 1, wherein the MEMS device is a SAW device, a BAW resonator or a FBAR resonator.

12. A method for producing a microelectromechanical systems (MEMS) device package, the method comprising:
    providing a microelectromechanical systems device package comprising:
        a substrate with a first substrate plane and a second substrate plane opposite the first substrate plane, a first and a second connector pad being arranged on the first substrate plane;
        a MEMS device with a first contact pad and a second contact pad arranged on a front side of the MEMS device, wherein the MEMS device is mounted in flip-chip technology on the first substrate plane, the front side facing the first substrate plane and the first and second contact pad being electrically interconnected with the first and second connector pad, thereby forming an interspace between MEMS device and first substrate plane;
        a film of a non-evaporable getter material disposed on the first substrate plane at least partially in the interspace; and
        a cover structure encapsulating the MEMS device and enclosing the MEMS device between the first substrate plane and the cover structure;
    sealing the package; and
    activating the non-evaporable getter material.

13. The method of claim 12, wherein providing the microelectromechanical systems device package comprises:
    providing the substrate and
    forming the film of the non-evaporable getter material on the first substrate plane.

14. The method of claim 13, wherein forming the film comprises sputter deposition, physical vapor deposition, printing, dip-coating or spin-coating of the non-evaporable getter material.

15. The method of claim 13, wherein forming the film comprises patterning the film of the non-evaporable getter material.

16. The method of claim 15, wherein patterning the film comprises:
    arranging a masking layer on the first substrate plane, the masking layer having openings exposing the first substrate plane, and removing the masking layer after disposing the film of the non-evaporable getter material; or
    structuring the film of the non-evaporable getter material by etching the film of the non-evaporable getter material after the film is on the first substrate plane.

17. The method of claim 12, wherein a vacuum is maintained when sealing the package or activating the non-evaporable getter material.

18. The method of claim 12, wherein activating the non-evaporable getter material comprises heat-activating the film of the non-evaporable getter material at a temperature between 150° C. and 500° C.

19. The method of claim 18, wherein the substrate further comprises a fifth connector pad and a sixth connector pad arranged on the first substrate plane, a seventh connector pad and an eighth connector pad arranged on the second substrate plane, the seventh connector pad being electrically interconnected with the fifth connector pad and the eighth connector pad being electrically interconnected with the sixth connector pad;
    wherein the film of the non-evaporable getter material is electrically interconnected with the fifth and sixth connector pad; and
    wherein heat-activating the film comprises applying an electrical current to the film of the non-evaporable getter material via the fifth, sixth, seventh, eighth connector pads.

20. A microelectromechanical systems device package, comprising:
    a substrate with a first substrate plane and a second substrate plane opposite the first substrate plane, a first connector pad, a second connector pad, a fifth connector pad and a sixth connector pad being arranged on the first substrate plane and a seventh connector pad and an eighth connector pad being arranged on the second substrate plane, the seventh connector pad being electrically interconnected with the fifth connector pad and the eighth connector pad being electrically interconnected with the sixth connector pad, wherein the substrate comprises a ceramic device with a stack of ceramic layers and an electrode layer arranged between the ceramic layers in the stack;
    a MEMS device with a first contact pad and a second contact pad arranged on a front side of the MEMS device, wherein the MEMS device is mounted in flip-chip technology on the first substrate plane, the front side facing the first substrate plane and the first and second contact pad being electrically interconnected with the first connector pad and second connector pad, respectively, thereby forming an interspace between MEMS device and first substrate plane;
    a film of a non-evaporable getter material disposed on the first substrate plane at least partially in the interspace, wherein the film of the non-evaporable getter material is electrically interconnected with the fifth connector pad and the sixth connector pad; and
    a cover structure encapsulating the MEMS device by sealing to the first substrate plane and enclosing the MEMS device between the first substrate plane and the cover structure.

* * * * *